United States Patent [19]
Pao

[11] Patent Number: 5,434,505
[45] Date of Patent: Jul. 18, 1995

[54] METHOD AND APPARATUS FOR LOW TEMPERATURE HEMT-LIKE MATERIAL TESTING

[75] Inventor: Yi-Ching Pao, Santa Clara, Calif.

[73] Assignee: Litton Systems, Inc., Santa Clara, Calif.

[21] Appl. No.: 99,849

[22] Filed: Jul. 30, 1993

[51] Int. Cl.$^6$ ............................................. G01R 27/04
[52] U.S. Cl. .................................. 324/234; 324/236; 324/719; 324/637
[58] Field of Search ............... 324/234, 236, 228, 248, 324/637, 633, 639, 719, 237, 238

[56] References Cited

U.S. PATENT DOCUMENTS

| | | | |
|---|---|---|---|
| 2,859,407 | 11/1958 | Henisch | 324/719 |
| 4,000,458 | 12/1976 | Miller et al. | 324/719 |
| 4,581,576 | 4/1986 | Wang | 324/719 |
| 4,605,893 | 8/1986 | Braslau | 324/719 |
| 4,704,576 | 11/1987 | Tributsch et al. | 324/719 |
| 5,103,182 | 4/1992 | Moslehi | 324/719 |
| 5,260,668 | 11/1993 | Mallory et al. | 324/719 |

Primary Examiner—Sandra L. O'Shea
Assistant Examiner—Roger C. Phillips
Attorney, Agent, or Firm—Lewis B. Sternfels; Robert F. Rotella; Gerald L. Cline

[57] ABSTRACT

To screen or test the electrical properties of HEMT-like wafers for their quality, the critical layer qualities of a wafer (16) are evaluated by measuring its conductivity (sigma or s) and mobility (mu or m) at upper and lower temperatures, which need only be sufficiently different as to remove uncertainties in the test data but, in practice, are room and liquid nitrogen temperatures. Novel equations show (1) that the crucial quality or merit factor ($n_s$) the electron sheet density of two-dimensional electron gas (2DEG), can be determined by measuring the total layer conductivity (sigma or s) at the lower or liquid nitrogen temperature and mobility (mu or m) at the upper or room temperature and (2) by measuring overall layer effective mobility (mu or m) at both room and liquid nitrogen (the upper and lower) temperatures to provide a means to measure the value of the 2DEG density, $n_s$ which has better accuracy then where the temperature of mobility is only made at room temperature.

23 Claims, 3 Drawing Sheets

METHOD AND APPARATUS FOR LOW TEMPERATURE HEMT-LIKE MATERIAL TESTING

This invention was made with Government support under contract F33615-91-C-1784 awarded by the Department of the Air Force. The Government has certain rights in this invention.

BACKGROUND OF THE INVENTION

1. Field of the Invention

The present invention relates to non-destructive testing of HEMT-like wafers, e.g., high electron mobility transistors (HEMT), pseudomorphic high electron mobility transistors (PHEMT), and double heterojunction high electron mobility transistors (DHPHEMT).

2. Description of Related Art and Other Considerations

HEMT-like wafers, as are manufactured, for example by a molecular beam epitaxy (MBE) method, are used as radio frequency and microwave frequency semiconductor devices. A typical wafer comprises a gallium arsenide substrate onto which deposits of five to ten layers, typically, are formed. The number of layers depends on the application to be used. These wafers are used to manufacture high electron mobility transistors (HEMT), pseudomorphic high electron mobility transistors (PHEMT), double heterojunction high electron mobility transistors (DHPHEMT), and the like.

Heretofore, there has been no effective way to non-destructively screen or test the electrical properties of HEMT-like or equivalently manufactured wafers for quality. The only method, to determine whether a wafer was satisfactory, was to build a device and then destructively test the device, such as by Hall measurements. This method is slow, time consuming, expensive and, because the tested wafer is destroyed, precludes 100% testing and reuse of the tested wafer.

An additional problem with conventional methods is that, in HEMT-like wafers having four to five or more layers, it is very difficult or even impossible to screen them for the properties of the critical layers. There is no way to distinguish whether the critical layers are good or bad. Thus, it has been necessary to utilize the expensive technique of constructing a wafer, at a cost from $5,000 to $10,000 per wafer, to determine if the wafer was good or bad.

Furthermore, if the surface of the wafer under test is irregular, such as having bad surface morphology with small textures, it is not possible to utilize conventional testing techniques.

SUMMARY OF THE INVENTION

These and other problems are successfully addressed and overcome by the present invention. The critical layer qualities of a wafer are evaluated by measuring conductivity (sigma or s) and mobility (mu or m) at two temperatures. The difference in temperature need only be sufficiently large to remove uncertainties in the test data. Practically, the temperatures to which the wafer under test is subjected are those of room and liquid nitrogen; however, less extreme differences in temperature may be used if the test results provide sufficient confidence to the party conducting the test.

Several advantages are derived from this testing arrangement. The testing is fast and time efficient relative to conventional techniques. It is inexpensive and, because the tested wafer is not destroyed, permits 100% testing and reuse of the tested water. Also, surface irregularities in the wafer under test are irrelevant to the test itself, that is, there is no metal contact to the wafer during the test.

Other aims and advantages, as well as a more complete understanding of the present invention, will appear from the following explanation of exemplary embodiments and the accompanying drawings thereof.

DETAILED DESCRIPTION OF THE PREFERRED EMBODIMENTS

Figure 1:
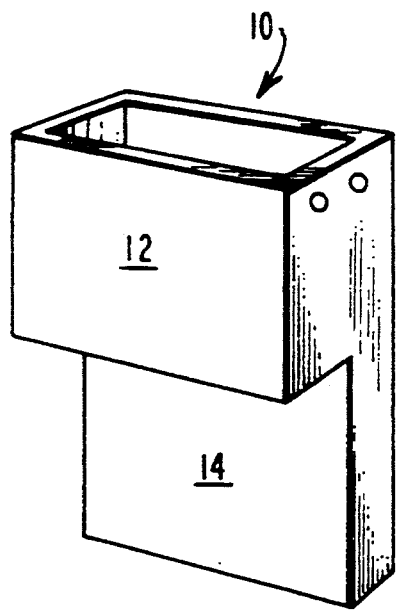
FIG. 1 is view of a holder suitable for holding a wafer to be tested under all temperature and other conditions of test, by use of the embodiments shown in FIGS. 2 and 3 and in FIG. 5.
Figure 2:
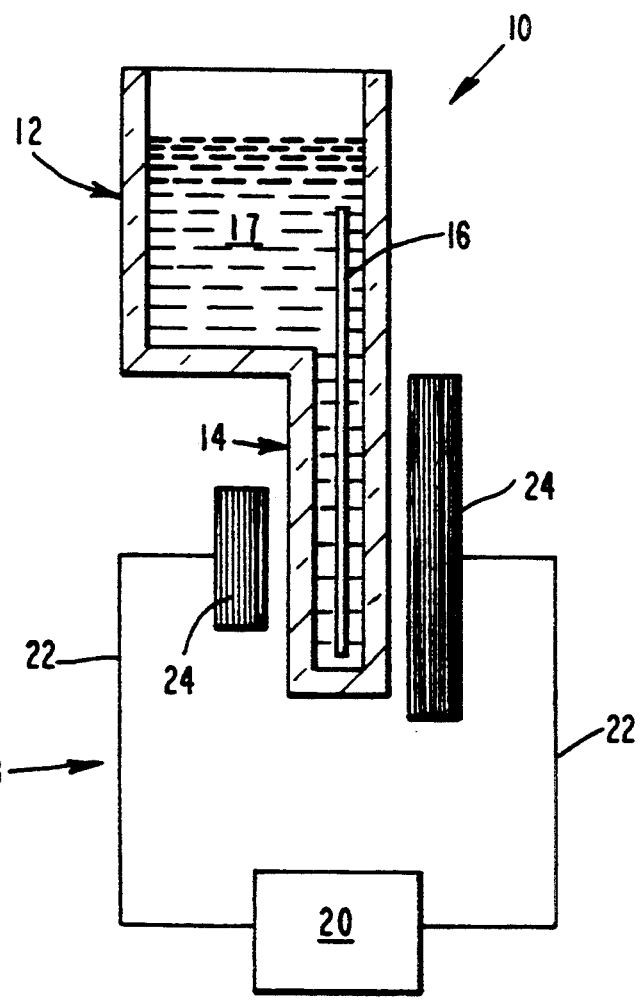
FIG. 2 depicts a test set up which is designed in accordance with one embodiment of the present invention utilizing radio frequency (RF) energy to generate eddy current in a wafer under test and which is used with the holder illustrated in FIG. 1.

As shown in FIGS. 1 and 2, a holder 10 for holding a wafer to be tested comprises an upper portion 12 and a lower portion 14. Lower portion 14 is sized to hold a wafer 16 generally upright therein, but to leave sufficient space also for receipt therein of a fluid 17, such as a cooling medium, which can fully surround the wafer. Upper portion 12 is sized to enable cooling medium 17 to be poured therein and to act as a reservoir for the cooling medium in sufficient quantity to cool the wafer during test. Cooling medium 17 preferably comprises liquid nitrogen and liquid helium.

Holder 10 may be constructed of any suitable material, preferably quartz, which is capable of withstanding liquid nitrogen and liquid helium temperatures and of not deleteriously affecting the electromagnetic energy passing therethrough and into wafer 16, so as not to absorb or reflect the energy.

As shown in FIG. 2, a radio frequency (RF) energy test set up 18 comprises an RF electromagnetic field source 20 coupled by suitable conductors 22 to a pair of pole pieces 24, which are positioned on either side of wafer 16.

Figure 3:
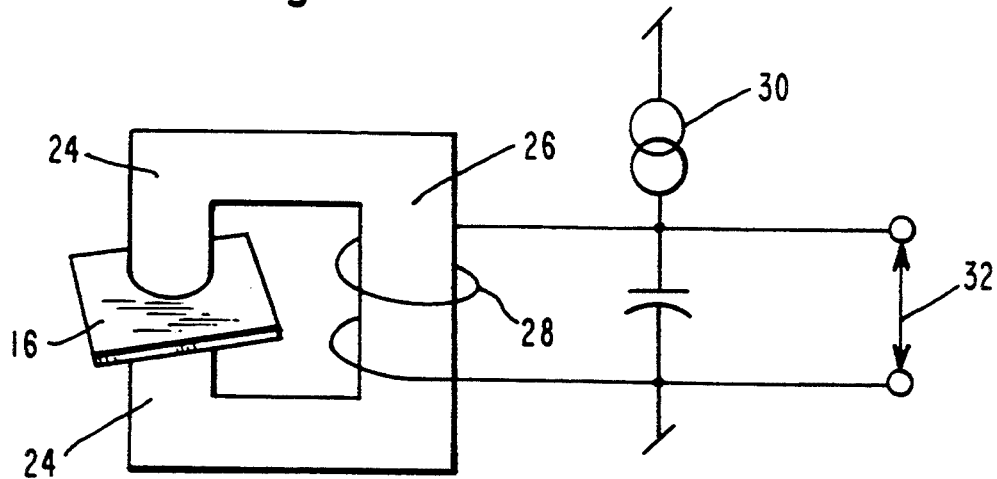
FIG. 3 is view in somewhat greater detail of the electrical circuitry useful in the arrangement illustrated in FIG. 2, comprising a simplified system for coupling a semiconductor sample to an oscillating RF electromagnetic field.

Test set up 18, which is more fully illustrated in FIG. 3, is of conventional construction and is described, for example, in an article entitled "Contactless measurement of semiconductor conductivity by radio frequency-free-carrier power absorption" in the Review of Scientific Instruments, a publication of the American Institute of Physics, Rev. Sci. Instrum., Vol. 47, No. 7, July 1976, pages 799-803. FIG. 3 herein is adapted from the first figure of the article. Pole pieces 24 are formed of a C-shaped ferrite material, having a center section 26. An inductive coil 28 is coiled about center section 26 and is electrically coupled to an RF current generator 30 and a source of RF voltage 32.

Briefly, and as described in above-referenced article from the Review of Scientific Instruments, "the power absorbed by a thin semiconductor slice in an oscillating electromagnetic field is accurately proportional to the material conductivity. The magnitude of this power absorption can be used to determine the conductivity by coupling the semiconductor to an amplitude-stabilized marginal oscillator and noting the power needed to maintain the demanded level of oscillation."

Further, "if a thin slice of semiconductor material is coupled to an rf tank circuit via a high-permeability ferrite core of circular cross section, as indicated in . . . [FIG. 3], then the oscillating . . . [electromagnetic] field sets up eddy currents in the semiconductor sheet, which leads to Joule heating of the material. . . . the power [$P_s$] absorbed is directly proportional to . . . [the semiconductor conductivity], or expressed differently to the product of the total number of free carriers in the gap times their mobility. . . . if one envisages a feed back system that holds . . . [the rms primary rf voltage] constant by adjusting the in-phase rf drive current . . . , then the power flowing into the semiconductor sample can be monitored by noting the change in the rf drive current itself."

In the present invention, this relationship is utilized at sufficiently different temperatures, such as at room and liquid nitrogen temperatures, to produce different eddy current in semiconductor wafer 16. Specifically, the two temperature measurements obtained by use of this prior art technique are described in novel equations discovered by the inventor, and show that the crucial quality or merit factor, $n_s$, the electron sheet density, can be determined by measuring conductivity (sigma or s) at liquid nitrogen temperatures and mobility (mu or m) at room temperature. In another equation developed by the inventor and described with respect to FIG. 4, mobility (mu or m) is measured at both room and liquid nitrogen temperatures to provide a value of $n_s$ which has better accuracy then where the temperature of mobility is only made at room temperature.

In the first equation, the following describes the formulae used in herein to derive the HEMT material parameters from test data. In general, the HEMT structure comprises two parallel conducting layers including the highly doped cap layer and the critical two-dimensional election gas (2DEG) layer.

(I) Total active layer conductance $s_{tot}(T)$=Cap conductance $s_c(T)$+2DEG Conductance $s_{2DEG}(T)$. Since $s(T)=s_c$ (e.g., the cap layer conductance), $s_{tot}(T)=s_c+s_{2DEG}(T)$, and let $T_1$=Liquid Nitrogen temperature and $T_r$=Room temperature. Accordingly, $$\frac{s_{2DEG}(T_1)}{s_{2DEG}(T_r)} = \frac{\frac{s_{tot}(T_1)}{s_{tot}(T_r)} + \frac{s_c}{s_{tot}(T_r)}}{\left(1 - \frac{s_c}{s_{tot}(T_r)}\right)} = \frac{m_{2DEG}(T_1)}{m_{2DEG}(T_r)}$$

and, therefore, $$n_s = \frac{[s_{tot}(T_1) - s_{tot}(T_r)]\left[1 - \frac{s_c}{s_{tot}(T_r)}\right]}{\left[m_{2DEG}(T_r)\left[\frac{s_{tot}(T_1)}{s_{tot}(T_r)} - 1\right]\right]}$$

The two-dimensional election gas (2DEG) sheet charge density is derived and obtained from measuring the total active layer conductances at liquid nitrogen and room temperature, and determines the cap layer conductance ($s_c$) and the 2DEG mobility (m) experimentally by growing separate samples. Since $m_{2DEG}(T_r)$ is a weak function of $n_s$ at room temperature, hence experimental data may be applied directly to the $n_s$ equation.

As stated above, conductivity (sigma or s) is measured using the prior art technique whereby a radio frequency (RF) or microwave frequency electromagnetic (EM) field is externally applied to the wafer to create an eddy current in the wafer from which conductivity measurements are extracted. The room temperature measurement is made in the test apparatus in the absence of liquid nitrogen. Liquid nitrogen is then added in order to make a conductivity measurement of liquid nitrogen. A pair of magnetic poles is added to the arrangement depicted in FIG. 2, which shows envelope or holder 10 with electromagnetic pole pieces 24 so that mobility can be measured at both room temperature and liquid nitrogen temperature.

Contrary to the conventional method of measuring mobility where the wafer must be processed and destroyed, wafer conductivity and mobility are measured without destruction and at liquid nitrogen temperatures. The following table compares actual measurements made by the prior art method of destructive testing and the novel non-destructive method of measuring wafer conductivities at liquid nitrogen and room temperature.

| Wafer No. | DESTRUCTIVE (PRIOR ART) Hall Data | | NOVEL NON-DESTRUCTIVE LN/RT Cond. Data | |
|---|---|---|---|---|
| DA278 (DHPHEMT) | $n_s = 2.76 \times 10^{12}$ | $cm^{-2}$ | $n_s = 2.78 \times 10^{12}$ | $cm^{-2}$ |
|  | $m_{300°K.} = 6070$ | $cm^2/V.s$ | $m_{300°K.} = 6100*$ | $cm^2/V.s$ |
|  | $m_{77°K.} = 17470$ | $cm^2/V.s$ | $m_{77°K.} = 18222$ | $cm^2/V.s$ |
| DA279 (DHPHEMT) | $n_s = 2.85 \times 10^{12}$ | $cm^{-2}$ | $n_s = 2.87 \times 10^{12}$ | $cm^{-2}$ |
|  | $m_{300°K.} = 6050$ | $cm^2/V.s$ | $m_{300°K.} = 6100*$ | $cm^2/V.s$ |
|  | $m_{77°K.} = 18050$ | $cm^2/V.s$ | $m_{77°K.} = 20700$ | $cm^2/V.s$ |
| DA280 (PHEMT) | $n_s = 1.96 \times 10^{12}$ | $cm^{-2}$ | $n_s = 2.02 \times 10^{12}$ | $cm^{-2}$ |
|  | $m_{300°K.} = 6469$ | $cm^2/V.s$ | $m_{300°K.} = 6500*$ | $cm^2/V.s$ |
|  | $m_{77°K.} = 27470$ | $cm^2/V.s$ | $m_{77°K.} = 27550$ | $cm^2/V.s$ |
| DA255 (DHPHEMT) | Bad surface morphology with small textures | | $n_s = 1.84 \times 10^{12}$ | $cm^{-2}$ |
|  |  |  | $m_{300°K.} = 6100*$ | $cm^2/V.s$ |

| Wafer No. | DESTRUCTIVE (PRIOR ART) Hall Data | NOVEL NON-DESTRUCTIVE LN/RT Cond. Data |
|---|---|---|
| | -continued | |
| | $m_{77°K}$ = 15910 | cm$^2$/V.s |

*Measured room temperature mobility on separate samples of two-dimensional electron gas (2DEG) layer for a given structure.

A comparison of the results obtained from the prior art destructive method and the non-destructive method of the present invention in the first three samples show extremely close agreement therebetween, thus proving that the method of the present invention is very accurate. The last sample shows that the prior art technique could not be used, because of bad surface morphology of the wafer. However, this bad morphology did not prevent use of the present invention and its non-destructive methods to obtain the desired measurements.

Figure 4:
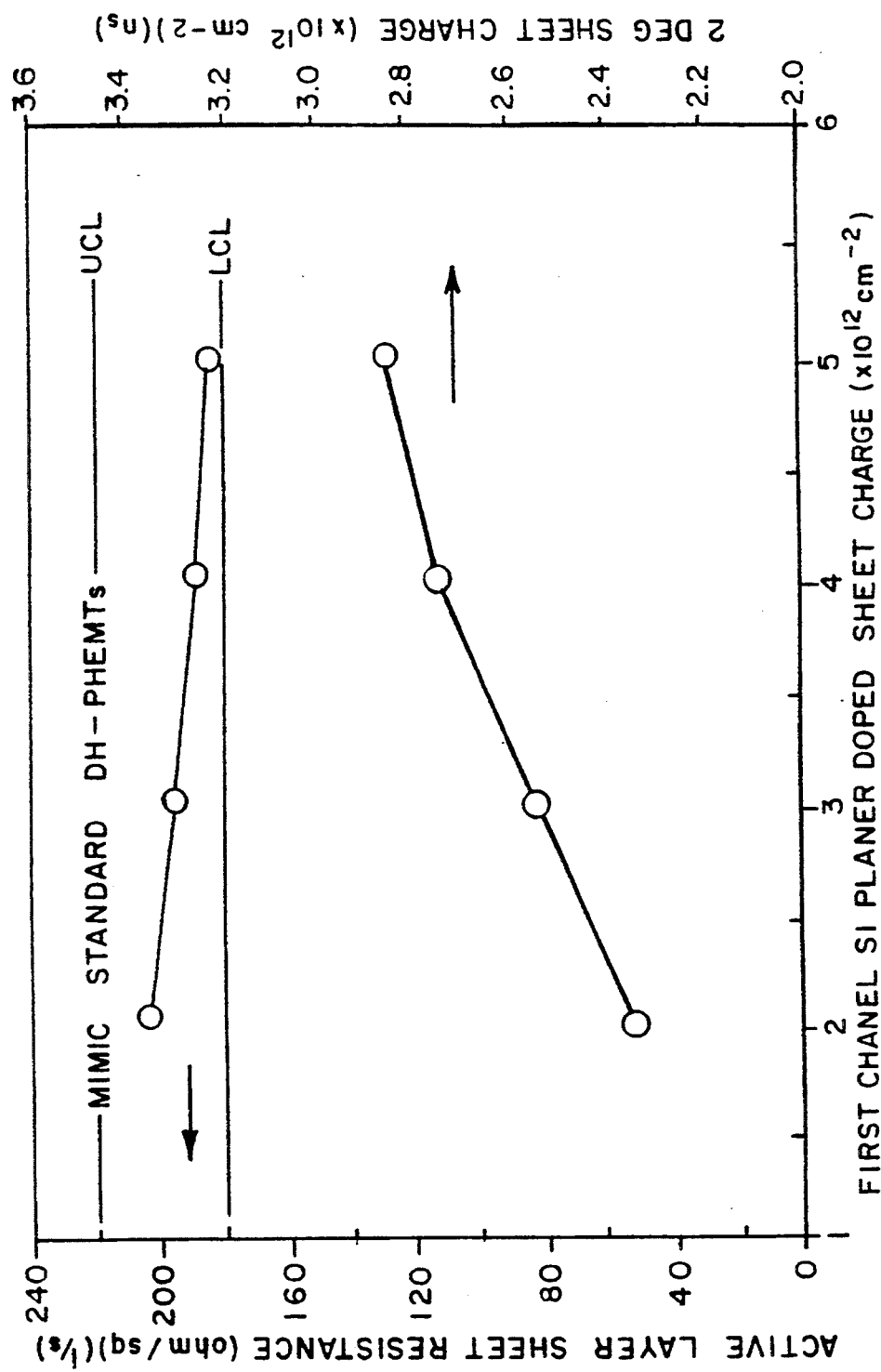
FIG. 4 is a graph, in which the x-axis is the varying concentration of silicon doping accomplished by preparing different samples of a MIMIC (microwave monolithic integrated circuit), in which the left hand axis is the inverse of conductivity, and in which the right hand axis is equal to the critical layer electron sheet density ($n_s$) of the wafer, obtained by use of the arrangement shown in FIGS. 2 and 3.

In the graph shown in FIG. 4, the term "MIMIC" is an acronym for "microwave monolithic integrated circuit" and "UCL" and "LCL" respectively are acronyms for "upper control limit" and "lower control limit," which were set for the purposes of experimentation. The top curve represents the inverse conductivity measured at room temperature. The bottom curve is the electron sheet density ($n_s$) of the wafer derived from conductivity tests performed at both liquid nitrogen and room temperatures. This graph shows, inter alia, that room temperature measurements can only furnish the conductivity but that the two-temperature method of the present invention can furnish the much more important quality parameter, $n_s$.

Figure 5:
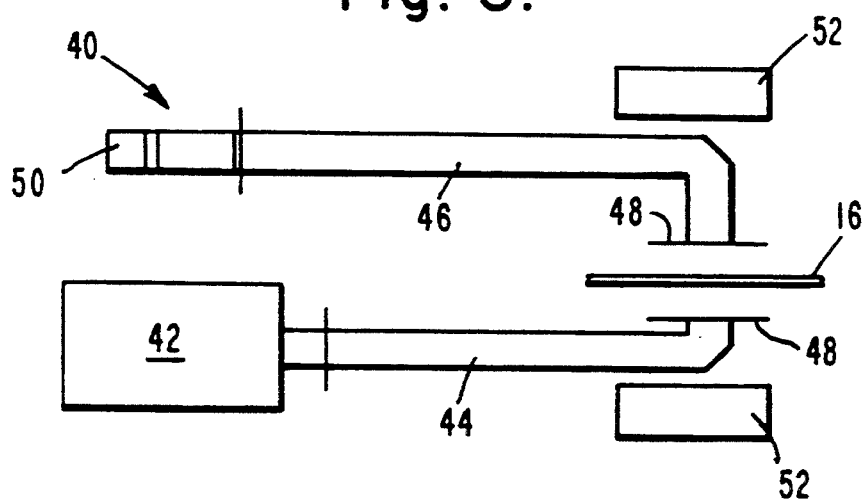
FIG. 5 is a test set up which is designed in accordance with another embodiment of the present invention utilizing electric microwave absorption (EMA) to measure wafer conductivity and electron mobility, and which is also used with the holder illustrated in FIG. 1.

Reference is now made to FIG. 5, in which a test set up 40, which is designed in accordance with another embodiment of the present invention, is also used with the holder shown in FIG. 1. In this embodiment, a source 42 of electric microwave absorption (EMA) is coupled by a waveguide 44 and a companion waveguide 46 at their termini 48 to wafer 16. Waveguide 46 is coupled at its other end to a reflective component 50. A pair of electro or permanent magnets 52 are positioned adjacent to termini 48 of waveguides 44 and 46 to generate eddy current in wafer 16. Test set up 40 is of conventional construction, being described, for example, in a paper by N. Braslau which was presented at the International Symposium on GaAs and related compounds, 1984, and printed in Inst. Phys. Conf. Ser. No. 74, Chapter 4, pages 269 et seq. Its use to test wafer 16 at different temperatures and to utilize the test data therefrom, however, is novel, in accordance with the following mathematical description.

Two general equations (1) and (2) are adapted from Hall measurements, as follows.

$$s = s_c + s_s = N_c m_c + n_s m_s \quad (1)$$

where
$N_c$ = Cap layer charge density
$m_c$ = Cap layer carrier mobility
$n_s$ = 2DEG sheet charge density
$m_s$ = 2DEG sheet change mobility.

$N_c$, $m_c$, $n_s$ are all temperature insensitive; thus, they are treated as constant values and not varied with temperature. While $m_s$ is sensitive to temperature, it has two values of mobility of $m_{SLN}$ at liquid nitrogen temperature (LN) and $m_{SRT}$ at room temperature (RT), respectively.

$$m_{eff} = \frac{N_c m_c^2 + n_s m_s^2}{N_c m_c + n_s m_s}, \quad (2)$$

where
$m_{eff}$ = the overall effective mobility
$m_{eLN}$ = effective mobility measured at LN temperature, and
$m_{eRT}$ = effective mobility measured at RT.

From equation (1) and equation (2) at two temperatures of LN and RT, one can derive the following:

$$s_c = \frac{s_{RT}[(s_{LN} - s_c)^2 m_{eRT} - (s_{RT} - s_c) s_{LN} m_{eLN}]}{(s_{LN} - s_{RT}) s_{LN} m_{eLN}} + \frac{s_{LN}[s_{LN} m_{eLN} - (s_{LN} - s_c) m_{eLN}](s_{LN} - s_c)}{(s_{LN} - s_{RT}) s_{LN} m_{eLN}}.$$

Because all parameters are measurable except $s_c$, this equation is solved for $s_c$, and then $m_{SLN}$ and $m_{SRT}$ are solved from $$\frac{m_{SLN}}{m_{SRT}} = \frac{s_{LN} - s_c}{s_{RT} - s_c} \text{ and } m_{SLN} = \frac{s_{LN} m_{eLN}}{s_{LN} - s_c}$$

$$n_s = \frac{s_{LN} - s_c}{m_{SLN}} \text{ or } n_s = \frac{s_{RT} - s_c}{m_{SRT}}$$

Thus, the values of interest for the two-dimensional election gas (2DEG) property assessment (i.e., $n_s$, $m_{SLN}$ and $m_{SRT}$) can be obtained.

In the case of advanced setup (i.e, which can measure both sample conductivity and effective carrier mobility), with the LN envelope concept, the formula derived to extract the desired parametric values are as follows:

The setup is capable of measuring sample overall conductivities and carrier mobilities at room temperature and LN temperature; they are denoted as $s_{RT}$—overall sample conductivity at room temperature (RT),
$s_{LN}$—overall sample conductivity at liquid mitogen temperature (LN),
$m_{eRT}$—effective sample carrier mobility at room temperature (RT), and
$m_{eLN}$—effective sample carrier mobility at liquid nitrogen (LN) temperature.

On HEMT (high electron mobility transistor) or PHEMT (pseudomorphic high electron mobility transistor) structures, their conductivity can be viewed as the sum of temperature insensitive cap layer conductance, which is denoted as $s_c$, and temperature sensitive two-dimensional election gas (2DEG) sheet conductance, which is denoted as $n_s m_{SLN}$ at liquid nitrogen (LN) temperature and $n_s m_{SRT}$ at room temperature (RT), $n_s$ being the two-dimensional election gas sheet change density which is treated as being constant with temperature. Thus, the conductance of the two-dimensional election gas sheet layer is mainly controlled by its LN (liquid nitrogen temperature) mobility ($m_{SLN}$) and RT (room temperature) mobility ($m_{SRT}$).

Although the invention has been described with respect to particular embodiments thereof, it should be realized that various changes and modifications may be made therein without departing from the spirit and scope of the invention.

What is claimed is:

1. A method for non-destructive testing of a HEMT-like wafer comprising the steps of:
   subjecting the wafer to uniformly applied higher and lower temperatures;
   utilizing a source of eddy currents to expose the wafer to eddy currents at the respective higher and lower temperatures while protecting the eddy current source from any temperature producing damage; and
   deriving conductivity and mobility data therefrom.

2. A method according to claim 1 in which said exposing step is effected by use of electric microwave absorption (EMA) for subjecting the wafer to the eddy currents.

3. A method according to claim 1 in which said exposing step is effected by use of radio frequency (RF) energy and an RF electromagnetic field coupled to the wafer on either side thereof for subjecting the wafer to the eddy currents.

4. A method according to claim 1 further comprising the step of selecting the lower and higher temperatures at sufficiently spaced apart temperatures to remove uncertainties in the test data.

5. A method according to claim 4 in which the lower temperature is at the temperature of liquid nitrogen and the upper temperature is at room temperature.

6. A method according to claim 1 further including the step of utilizing fluids for applying the temperatures to the wafer, utilizing a holder having first and second portions for containing the fluids and the wafer, and sizing the first and second portions respectively to support the wafer and to form a reservoir for the fluids.

7. A method according to claim 6 further comprising the step of selecting the fluids as liquid nitrogen and air at room temperature.

8. Apparatus for non-destructive testing of a HEMT-like wafer comprising a mechanism adapted to expose the wafer to eddy currents at respective higher and lower temperatures, a mechanism adapted to derive conductivity and mobility data therefrom, and a holder adapted to hold the wafer within temperature applying fluids for uniformly applying the temperatures to the wafer and to insulate the mechanism from exposure to any mechanism damaging temperature.

9. Apparatus according to claim 8 in which said exposing mechanism comprises waveguides having first and second termini at their respective ends, said first termini being coupled to the wafer on opposite surfaces thereof, a source of electric microwave absorption (EMA) coupled to one of said waveguide second ends, a reflective component coupled to a second of said waveguide second ends, and magnets positioned adjacent to said waveguide termini to generate eddy currents in the wafer.

10. Apparatus according to claim 8 in which said exposing mechanism comprises a radio frequency (RF) energy test set up including an RF electromagnetic field source coupled to a pair of pole pieces, which are positioned on either side of said wafer.

11. Apparatus according to claim 8 in which the lower and higher temperatures are at sufficiently spaced apart temperatures to remove uncertainties in the test data.

12. Apparatus according to claim 11 in which the lower temperature is at the temperature of liquid nitrogen and the upper temperature is at room temperature.

13. Apparatus according to claim 8 further including fluids for applying the temperatures to the wafer, and a holder having first and second portions for containing the fluids and the wafer, said first and second portions being sized respectively to support the wafer and to form a reservoir for the fluids.

14. Apparatus according to claim 13 in which the fluids comprise liquid nitrogen or liquid helium and air at room temperature.

15. A method for non-destructive testing of a HEMT-like wafer comprising the steps of:
   exposing the wafer to eddy currents at respective higher and lower temperatures by use of electric microwave absorption (EMA) for subjecting the wafer to the eddy currents; and
   deriving conductivity and mobility data therefrom, in which said deriving step is derived from the equations:

$$S_c = \frac{S_{RT}[(S_{LN} - S_c)^2 m_{eRT} - (S_{RT} - S_c)S_{LN}m_{eLN}]}{(S_{LN} - S_{RT})S_{LN}m_{eLN}} + \frac{S_{LN}[S_{LN}m_{eLN} - (S_{LN} - S_c)m_{eLN}](S_{LN} - S_c)}{(S_{LN} - S_{RT})S_{LN}m_{eLN}}, \text{ and}$$

$$n_s = \frac{S_{LN} - S_c}{m_{SLN}} \text{ and } n_s = \frac{S_{RT} - S_c}{m_{SRT}},$$

where $n_s$ is the 2DEG sheet charge density, $s_{LN}$ is the conductivity measurement taken at the lower temperature, $s_c$ is the conductivity of parallel conductive layers in the device structure adjacent to the 2DEG channel, $s_{RT}$ is the conductivity measurement at the higher temperature, $m_{SLN}$ is the mobility measurement taken at the lower temperature, and $m_{SRT}$ is the mobility measurement taken at the higher temperature.

16. A method for non-destructive testing of a HEMT-like wafer comprising the steps of:
   exposing the wafer to eddy currents at respective higher and lower temperatures by use of radio frequency (RF) energy and an RF electromagnetic field coupled to the wafer on either side thereof for subjecting the wafer to the eddy currents; and
   deriving conductivity and mobility data therefrom, in which said deriving step is derived from the equation:

$$n_s = \frac{[S_{tot}(T_1) - S_{tot}(T_r)]\left[1 - \frac{S_c}{S_{tot}(T_r)}\right]}{\left[m_{2DEG}(T_r)\left[\frac{S_{tot}(T_1)}{S_{tot}(T_r)} - 1\right]\right]}$$

where $n_s$ is the electron sheet density, $s_{tot}(T_1)$ is the total conductance measurement at the lower temperature, $S_{tot}(T_r)$ is the total conductance measurement at the higher temperature, $s_c$ is the parallel conductive layers adjacent to the 2DEG channel, and $m_{2DEG}(T_r)$ is mobility measurement of the two-dimensional gas layer at the higher temperature.

17. A method for non-destructive testing of a HEMT-like wafer comprising the steps of exposing the wafer to uniformly supplied temperatures approximating those of liquid nitrogen and liquid helium, exposing the wafer to eddy currents at the two temperatures while protecting a source of the eddy currents from any temperature producing damage, and deriving mobility data therefrom.

18. A method for non-destructive testing of a HEMT-like wafer comprising the steps of utilizing implementation for measuring the electron sheet density of the wafer at a uniformly applied room temperature and at uniformly supplied temperatures approximating those of liquid nitrogen and liquid helium while protecting the electron sheet density measuring implementation from any temperature producing damage, and deriving conductivity data from the two temperature measurements and mobility data from the room temperature measurement.

19. A method for non-destructive testing of a HEMT-like wafer comprising the steps of subjecting the wafer to uniformly applied room temperature and to uniformly applied temperatures approximating those of liquid nitrogen and liquid helium, measuring the electron sheet density of the wafer at the room and liquid nitrogen/helium temperatures, and deriving conductivity and mobility data from the two temperature measurements.

20. Apparatus for non-destructive testing of a HEMT-like wafer comprising a mechanism adapted to expose the wafer to eddy currents at respective higher and lower temperatures, and a mechanism adapted to derive conductivity and mobility data therefrom, in which said deriving mechanism is programmed with the equations:

$$n_s = \frac{S_{LN} - S_c}{m_{SLN}} \text{ and } n_s = \frac{S_{RT} - S_c}{m_{SRT}}$$

where $n_s$ is the 2DEG sheet charge density, $s_{LN}$ is the conductivity measurement taken at the lower temperature, $s_c$ is the conductivity of the parallel conductive layers adjacent to the 2DEG channel, $s_{RT}$ is the conductivity measurement at the higher temperature, $m_{SLN}$ is the 2DEG mobility measurement taken at the lower temperature, and $m_{SRT}$ is the 2DEG mobility measurement taken at the higher temperature.

21. Apparatus for non-destructive testing of a HEMT-like wafer comprising a mechanism adapted to expose the wafer to eddy currents at respective higher and lower temperatures, and a mechanism adapted to derive conductivity and mobility data therefrom, in which said deriving mechanism is programmed with the equation:

$$n_s = \frac{[S_{tot}(T_1) - S_{tot}(T_r)]\left[1 - \frac{S_c}{S_{tot}(T_r)}\right]}{\left[m_{2DEG}(T_r)\left[\frac{S_{tot}(T_1)}{S_{tot}(T_r)} - 1\right]\right]}$$

where $n_s$ is the 2DEG electron sheet density, $S_{tot}(T_l)$ is the total conductance measurement at the lower temperature, $S_{tot}(T_r)$ is the total conductance measurement at the higher temperature, $s_c$ is the parallel conductive layers adjacent to the 2DEG channel, and $m_{2DEG}(T_r)$ is mobility measurement of the two-dimensional gas layer at the higher temperature.

22. A holder for use with non-destructive testing by electromagnetic energy of a HEMT-like wafer comprising first and second portions for containing relatively high and low temperature fluids and the wafer and for segregating a source of the electromagnetic energy from any damage from the fluids, said first and second portions being sized respectively to support the wafer fully within the fluids and to form a reservoir for the fluids.

23. Apparatus according to claim 22 in which the fluids comprise liquid nitrogen or liquid helium and air at room temperature, and said holder is formed of a material which is adapted to withstand liquid nitrogen and liquid helium temperatures and adapted to resist damage to said holder by the electromagnetic energy passing through and absorption or reflection of the energy by said holder.

* * * * *